United States Patent [19]

Mahler

[11] Patent Number: 4,589,369
[45] Date of Patent: May 20, 1986

[54] DEVICE FOR HOLDING A SUBSTRATE

[75] Inventor: Peter Mahler, Hainburg, Fed. Rep. of Germany

[73] Assignee: Leybold Heraeus GmbH, Cologne, Fed. Rep. of Germany

[21] Appl. No.: 714,098

[22] Filed: Mar. 20, 1985

[30] Foreign Application Priority Data

Mar. 27, 1984 [DE] Fed. Rep. of Germany ....... 3411208

[51] Int. Cl.⁴ .............................................. B05C 13/02
[52] U.S. Cl. .................................... 118/500; 118/728; 211/41
[58] Field of Search ............... 118/500, 728, 729, 730; 211/41; 219/10.67; 206/454, 455

[56] References Cited

U.S. PATENT DOCUMENTS 4,449,478 5/1984 Kraus .................................. 118/720

FOREIGN PATENT DOCUMENTS 0020873 10/1983 European Pat. Off. .

Primary Examiner—Norman Morgenstern
Assistant Examiner—K. E. Jaconetty
Attorney, Agent, or Firm—Felfe & Lynch

[57] ABSTRACT

A device for holding one or more substrates, each of substantially circular profile, especially in vacuum coating apparatus. In a vertical plate there is provided an opening on whose edge holding means are provided into which each substrate is fitted. In accordance with the invention, the opening has in its bottom area an approximately semicircular radial groove which is defined on both sides by semicircular rims. In its upper portion the opening has on one side a lip which merges with one of the rims in the lower part of the opening. On the other side there is disposed a counterbore offset eccentrically upward from the opening, whose radius is at least as great as the radius of the groove bottom. In this manner an insertion opening is formed on one side of the plate for the eccentric insertion of the substrate.

5 Claims, 3 Drawing Figures

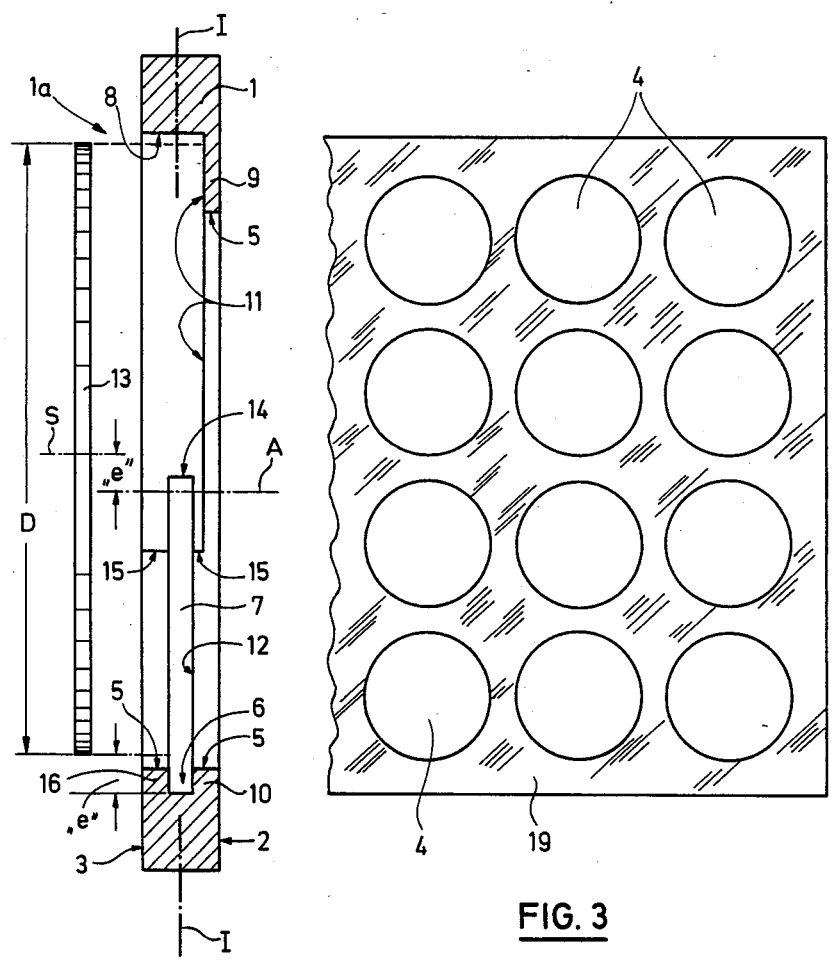

DEVICE FOR HOLDING A SUBSTRATE

The invention relates to a device for holding one or more substrates of substantially circular shape, especially in vacuum coating apparatus, having at least one substantially circular recess disposed in a plate and having on its margin a partially circular, radial groove running parallel to the principal plane of the plate for the insertion of a substrate, this groove being defined on both sides by rims whose distance from each other corresponds to the substrate thickness.

Holding devices in vacuum coating apparatus are known in many forms. Dished substrate holders with circular openings whose axes are aligned substantially with a central coating source (evaporator) have achieved widespread use. Metal springs and other mechanical catching means have been used as the holding means, which grasp the substrate at several points on its circumference in the manner of clips. The substrates involved are, for example, lenses (eyeglass lenses), filters and reflectors whose surface is to be coated as uniformly as possible.

Holding means for holding substrates are known, in which the plate is guided in a substantially vertical position through a cathode sputtering apparatus in which the substrates are coated simultaneously on both sides by sputtering cathodes in a mirror-image relationship. Even in substrate holders of this kind, metal springs and other mechanical means have been used for holding the substrates.

The known holding means, however, have a number of disadvantages. A number of pretreatment processes as well as conventional coating processes greatly heat the substrates, so that the springs are subject to great wear by annealing. Furthermore, the known holding means result in so-called "clip marks" on the substrates, which are to be attributed to their blocking the coating material. Furthermore, substrate holders having mechanical holding means are hard to clean, and manipulating them when loading the substrate holders is relatively complicated, especially when so-called robots are used for the coating.

European Patent Publication No. 0,020,873 discloses a substrate holder designed only for the unilateral ion bombardment or implantation of the substrates and therefore is closed on the side opposite the insertion side. On the insertion side itself there is provided a rib or lip 71 which extends over only about a sixth of the circumference of the opening, but on the other hand it extends very far radially inwardly and therefore shields or masks a considerable part of the substrate against the ion bombardment. Nevertheless, this rib would be unable to prevent the substrate from falling forward from the vertical position and assuming an inclined position. The substrate holder must therefore be loaded with substrates in the horizontal position and brought to a high rotational speed so that the substrates will be held additionally by centrifugal force and the substrate holder can be swung into the vertical position for the ion bombardment. This, however, works only when the substrates have a relatively great thickness and a square edge so that the centrifugal force will give them the necessary "standability". This known substrate holder is not suitable for thin substrates and those with round edges.

The invention is therefore addressed to the problem of devising a device for holding substrates, by means of which a simultaneous coating of both sides of the substrates in the vertical position will be possible, and which can be loaded with substrates also in the vertical position and will hold the substrates reliably in the vertical position without centrifugal force and without masking large marginal portions of the substrates.

The solution of the above-stated problem is accomplished in a substrate holder by:

(a) making the opening for the simultaneous bilateral coating of the substrates run all the way through the plate;

(b) making the rim that is on the insertion side extend approximately semicircularly over the lower half of the circumference of the opening;

(c) providing the upper half of the circumference of the opening on the insertion side with a counterbore offset eccentrically by at least the groove depth and extending past the groove in the direction of the thickness of the plate, the radius of the said counterbore being at least as great as the radius of the groove bottom; and (d) making the rim on the side opposite the insertion side extend at least approximately semicircularly over at least likewise the lower half of the circumference of the opening.

By the above-described geometry of the wall elements of the opening, a one-piece substrate holder is created into which the substrates can be fitted and held in the inserted position by the force of gravity. This is accomplished without the use of heat-sensitive components such as steel springs. A substantially more uniform masking is accomplished, which can be kept very low on account of the narrowness of the rims on both sides of the groove. The holding device of the invention is easy to clean, for example in acid baths. It furthermore permits very simple handling, and it can also be loaded by robots: the substrates are simply inserted from the side with their principal plane in the vertical position and lowered onto the bottom of the groove. By means of the lip disposed on one side in the upper portion, which together with the corresponding rim in the lower portion substantially forms a circle, it is also brought about that interchange of the coating material between the opposite sides is effectively prevented. This interchange of coating material between the opposite sides is in many cases undesirable because the condensation takes place at different rates and from different directions, so that, as a rule, the consequences are poor quality coating properties, but especially insufficient adherence of the coatings to the substrate. Such an advantage is virtually impossible to obtain with the known holding devices.

With regard to the production of such a holding device, which will be further explained in the detailed description, it is especially advantageous for the opening to be composed of surfaces of rotation with at least three different radii, as follows:

(a) a first bore made all the way through the plate, with a radius $R1$ which is smaller than half of the substrate diameter $D$;

(b) an approximately semicircular groove bottom concentric with the first bore at about half the thickness of the plate with respect to the first bore, with a radius $R2$ which is larger than $R1$; and (c) a counterbore of the radius $R3$ situated in the upper portion and offset eccentrically upward and which extends in the direction of the thickness of the plate at least past the groove bottom, R3 being greater than R2 which is greater than R1.

These surfaces of rotation are defined by radial surfaces, the outermost radial surfaces being edge surfaces of the two faces of the plate.

It is especially advantageous if, between the bottom of the counterbore and the opposite face of the plate there is a wall thickness that is less than the thickness of the rim in the lower area of the opening. This prevents the substrate, if it is reliably guided, from colliding upon insertion against the thinner upper lip, and from being scratched in its lower portion when lowered into the groove. This is important because coating material deposits itself during the coating process on the lip in the upper portion, resulting in considerable surface roughness by accumulation over a period of time.

In accordance with the invention, a device for holding a substrate of substantially circular shape comprises a plate having at least one substantially circular opening disposed therein. The plate has a partially circular radial groove at an edge of the opening and running parallel to the principal plane of the plate for the insertion of a substrate from one side of the plate. The groove is defined on both sides by rims whose distance apart corresponds to the substrate thickness. The opening is for the simultaneous bilateral coating of the substrate and extends all the way through the plate. The circumference of the opening has a lower half and an upper half. One of the rims is on the insertion side of the plate and extends approximately semicircularly over the lower half of the circumference of the opening. The upper half of the circumference of the opening has on the insertion side a counterbore extending in the direction of the thickness of the plate beyond the groove and offset eccentrically by at least the depth of the groove. The radius of the counterbore is at least as great as the radius of the bottom of the groove. The other of the rims is disposed on the opposite side of the plate and extends at least approximately semicircularly over at least the lower half of the circumference of the opening.

For a better understanding of the invention, together with other and further objects thereof, reference is made to the following description, taken in connection with the accompanying drawings, and its scope will be pointed out in the appended claims.

Referring now to the drawings, an embodiment of the invention will be further described with the aid of FIGS. 1 to 3, in which the geometric relationships are exaggerated, and in which:

FIG. 2 is an axial cross-section along the bore axis (line II—II in FIG. 1); and FIG. 3 is a multiple arrangement of the subject matter of FIG. 1 in a common plate.

Figure 1:
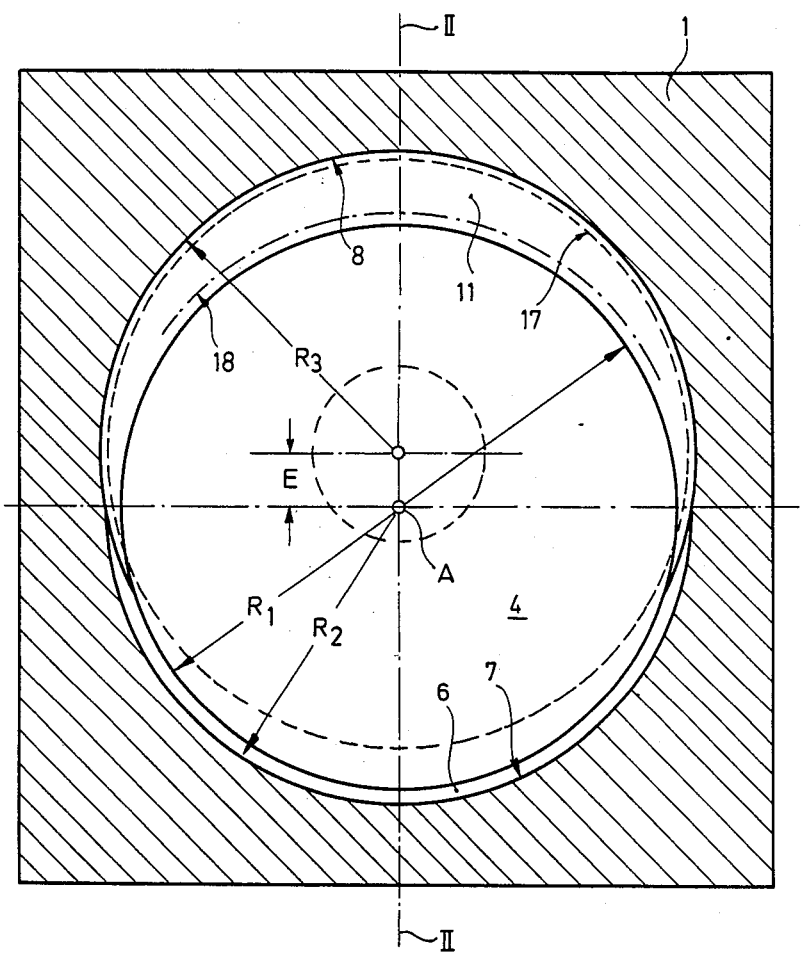
FIG. 1 is a radial cross-section through the center of the plate (principal plane I—I in FIG. 2)

In FIGS. 1 and 2 there is represented a plate which is defined by two plane-parallel surfaces 2 and 3. In connection with the purpose for which it is to be used, the plate 1 has an insertion side 1a, i.e., it is on this side that the substrates are inserted into the holder. In this plate 1 there is an opening 4 whose geometrical shape is most simply described by the method whereby it is made.

First an axis A is established in the plate 1, which preferably coincides with the position of the substrate axis S when the substrate is inserted into position. Then, a first bore 5 of a radius R1 is prepared which goes all the way through the plate and is smaller than the substrate diameter D. This bore manifests itself first in a cylinder having the axis A.

Then, at about half the depth of the first bore, a groove 6 with the bottom 7 preferably is cut into its wall, and has a radius R2, which is greater than R1 and preferably is substantially equal to half of the substrate diameter D. In this manner a rotationally symmetrical arrangement of bore and groove results, which corresponds substantially to the cross-section in the bottom half of FIG. 2.

Then, with an eccentricity E corresponding to at least half the depth of the groove, but preferably slightly greater, a counterbore 8 is made from the insert side 1a, having the radius R3, R3 in turn being at least as great as, and preferably being slightly greater than, the radius R2. This procedure removes the rim of the groove from the upper end of the plate, along with the portion of the groove bottom 7 that is situated in the same upper end. The counterbore 8 is carried to such a depth past the groove 6 that a lip 9 is left between the counterbore 8 and the opposite surface 2 of the plate 1, whose thickness preferably is less than the thickness of the outer rim 10 of the groove in the bottom part of the opening 4. It can be seen that the lip 9 and rim 10 together substantially form a circle as seen through the recess 4, but that the lip 9 is thinner than rim 10. The statement that this is substantially a circle includes the fact that in the upper part of the opening the counterbore 8 creates a cut-out with a sickle-shaped, planar floor that is the bottom 11 of the counterbore 8. The bottom 11 is consequently offset from the lateral boundary surface 12 of the groove 6 by such an amount that the substrate 13, when inserted in a position parallel to the principal plane of the plate 1 in no way comes in contact with the bottom 11 or with the coating material deposited thereon. The eccentricity E and the radius R3 of the counterbore 8 are selected such that, even in the area of a diameter through the axis A perpendicular to the line II—II the material is sufficiently cut away so that the insertion of the substrate 13 is not hampered.

By the creation of the counterbore 8, not only the one rim of the groove is removed but also preferably about half of the groove bottom 7, and the latter then terminates at two axis-parallel lines 14 at which the surfaces of rotation of the counterbore 8 on the one hand and of the groove bottom 7 on the other, merge with one another. The surfaces of rotation of the first bore 5 on the one hand and of the counterbore 8 on the other merge with one another along additional lines 15. The necessary clearance is obtained by their depth below the axis A.

On account of the offset of counterbore 8 from the axis A, a rim 16 is, of course, left on the front side of plate 1, but it preferably extends over slightly less than half the circumference of the opening 4 (with respect to the axis A).

In the manner described, the opening 4 has in its lower portion the approximately semicircular, radial groove 6 running parallel to the principal plane of the plate 1, which is defined on both sides by semicircular rims 10 and 16 directed radially inwardly. The distance between them corresponds to the substrate thickness. In the upper part of the opening, the lip 9 is still present, which together with the corresponding rim 10 substantially makes up the already described circle. It is this lip 9 which, when the substrate 13 is inserted, prevents the coating material from passing over onto the opposite side of the plate 1. By the above-described geometry, an insertion opening is formed on one side of the plate for the off-center insertion of the substrate to a point above the groove 6. This insertion will now be described in detail.

The substrate 13, which may, for example, comprise a circular disk of aluminum onto which a layer of ferromagnetic material is to be deposited by cathode sputtering (production of so-called magnetic storage disks), is located at first (preferably held by a robot) in a position relative to the plate 1 or to its opening 4, as represented in FIG. 2, i.e., the principal plane of the substrate 13 preferably is parallel to the principal plane of the plate 1. Here the substrate axis S is raised upwardly by an amount e which can be the same, for example, as the eccentricity E. Then the substrate 13 is moved along the broken line into the opening 4 until it is situated approximately centrally above the groove 6. Then the substrate 13 is lowered by the amount e until the bottom edge of the substrate 13 lies on the bottom of groove 7. The substrate is now reliably held in the groove 6, on about half of its circumference. It is now no longer possible, even if the plate 1 is tilted considerably, to make the substrate fall out leftwardly (as seen in FIG. 2).

In FIG. 1, the broken line 17 indicates the starting position of the substrate 13 in accordance with FIG. 2. The dash-dotted line 18, which indicates only a part of the circumference of the substrate, shows the latter in the lowered position in which the substrate rests on the bottom of the groove 7. It can be seen that, between the bottom 11 and this line 18, the overlap is about the same as it is between the substrate and the rim 10. It is in this manner that the above-mentioned passage of coating material is effectively prevented.

FIG. 3 shows the multiple arrangement of the principle represented in FIGS. 1 and 2 in a correspondingly larger plate 19, in which a plurality of openings 4 is provided. For the sake of simplicity, and on account of the scale selected, the details at the edge of these openings is not represented.

As already stated, the situation in FIGS. 1 and 2 is represented in an exaggerated manner for comprehension. In practice, the eccentricity E in the case of a substrate diameter of, for example, 130 mm will preferably be 5 mm, and the depth of the groove will preferably be no more than about 2 mm. The innermost circle represented by the broken line in FIG. 1 indicates the opening commonly present in magnetic storage disks. Into it can be inserted a plug to prevent coating material from coming through it.

The substrate holder is suitable for all possible, approximately disk-shaped substrates, such as lenses (eyeglass lenses), filters, reflectors etc. Also parabolic mirrors having annular flanges can be inserted and coated preferably on one side in order, for example, to produce cold-light reflectors.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A device for holding a substrate of substantially circular shape comprising;

a plate having at least one substantially circular opening disposed therein, said plate having a partially circular radial groove disposed at an edge of said opening and running parallel to the principal plane of said plate for the insertion of a substrate from one side of said plate, said groove being defined on both sides by rims whose distance apart corresponds to the substrate thickness;

said opening being for the simultaneous bilateral coating of the substrate and extending all the way through said plate, the circumference of said opening having a lower half and an upper half;

one of said rims being on said insertion side of said plate and extending approximately semicircularly over said lower half of said circumference of said opening;

said upper half of said circumference of said opening having on said insertion side a counterbore extending in the direction of the thickness of said plate beyond said groove and offset eccentrically by at least the depth of said groove, the radius of said counterbore being at least as great as the radius of the bottom of said groove; and the other of said rims being disposed on the opposite side of said plate and extending at least approximately semicircularly over at least said lower half of said circumference of said opening.

2. A holding device in accordance with claim 1, in which said opening comprises three surfaces of rotation with at least three different radii, including:

a first bore passing through said plate, with a radius that is less than half of the substrate diameter;

a concentric, approximately semicircular groove bottom with a radius and, lying approximately at half the thickness of said plate with respect to said first bore, said radius of said groove bottom being greater than said radius of said first bore; and said counterbore with a radius and offset eccentrically upward and which extends in the direction of the thickness of the plate at least beyond the groove bottom, said radius of said counterbore being greater than said radius of said groove bottom.

3. A holding device in accordance with claim 2, in which said counterbore has a bottom and which includes, between said bottom of said counterbore and the surface of said plate at said opposite side thereof, a wall having thickness which is less than the thickness of said other rim.

4. A holding device in accordance with claim 1, in which said plate comprises high-grade steel.

5. A holding device in accordance with claim 1 for holding a substrate in vacuum coating apparatus.

* * * * *